United States Patent [19] [11] 4,395,433
Nagakubo et al. [45] Jul. 26, 1983

[54] METHOD FOR MANUFACTURING A SEMICONDUCTOR DEVICE HAVING REGIONS OF DIFFERENT THERMAL CONDUCTIVITY

[75] Inventors: Yoshihide Nagakubo; Susumu Kohyama, both of Kawasaki, Japan

[73] Assignee: Tokyo Shibaura Denki Kabushiki Kaisha, Kawasaki, Japan

[21] Appl. No.: 207,934

[22] Filed: Nov. 18, 1980

[30] Foreign Application Priority Data

Nov. 22, 1979 [JP] Japan ................... 54-150731

[51] Int. Cl.³ ............... H01L 21/26; H01L 21/268
[52] U.S. Cl. ...................... 427/35; 148/1.5; 156/603; 427/53.1; 427/86
[58] Field of Search ............ 427/35, 53.1, 86; 156/603; 143/1.5

[56] References Cited

U.S. PATENT DOCUMENTS

| 4,027,053 | 5/1977 | Lesk | 427/53.1 |
| 4,059,461 | 11/1977 | Fann | |
| 4,155,779 | 5/1979 | Auston | 148/1.5 |
| 4,292,091 | 9/1981 | Togei | 427/53.1 |
| 4,292,093 | 9/1981 | Ownby | 427/53.1 |
| 4,305,973 | 12/1981 | Yaron | 427/35 |

FOREIGN PATENT DOCUMENTS

| 48-102976 | 12/1973 | Japan . |
| 54-3466 | 6/1979 | Japan . |
| 1358438 | 7/1974 | United Kingdom . |
| 1498459 | 1/1978 | United Kingdom . |

OTHER PUBLICATIONS

M. Hanabussa et al., "Laser-Induced Vapor Deposition of Silicon," Appl. Phys. Lett., vol. 35, No. 8, Oct. 1979, pp. 626-627.

Primary Examiner—John D. Smith
Attorney, Agent, or Firm—Finnegan, Henderson, Farabow, Garrett & Dunner

[57] ABSTRACT

In gas phase growth of a polysilicon layer on a semiconductor substrate, a silicon layer of a single-crystal structure or a structure akin thereto may be formed only on an exposed surface of the substrate surrounded by an insulating film for element isolation by applying an energy beam to the substrate. A semiconductor device obtained by forming such an element as an MOS transistor on the silicon layer is free from any difference in level between an element region and an element isolation region, and hence from snapping or disconnection of any wiring traversing the boundary between those regions.

10 Claims, 5 Drawing Figures

METHOD FOR MANUFACTURING A SEMICONDUCTOR DEVICE HAVING REGIONS OF DIFFERENT THERMAL CONDUCTIVITY

This invention relates to a method and an apparatus for manufacturing a semiconductor device, more specifically to a method and an apparatus for manufacturing a semiconductor device capable of reducing the difference in height, or level, between an element region and an element isolation region or field oxide film region.

In a semiconductor device, an insulating film is formed between semiconductor elements for electrical isolation of one element from another. Wires connected to the several elements are disposed on the element isolation insulating film. As shown in FIG. 1, for example, a transistor element region A including a source 2 and a drain 3 formed in a semiconductor substrate 1, a gate oxide film 4, and a gate electrode 5 formed thereon is surrounded by an insulating film 6 for element isolation such as $SiO_2$ formed on the substrate 1. Thus, the insulating film 6 for element isolation constitutes an element isolation region B for electrically isolating one element from another adjacent thereto. The existence of the thick insulating film inevitably causes a difference in level between the element region A and the element isolation region B. In arranging aluminium wiring 8 on an insulating film 7, therefore, there is a great danger of the wiring 8 snapping at the stepped portion created by the difference in levels. This poses a significant problem for the reliability and mass production of the semiconductor device. In large scale integration of semiconductor devices, in particular, the patterning width of the wiring, as well as the thickness thereof, are reduced, so that the occurrence of the snapping or disconnection of the wiring becomes a more serious problem.

This invention is intended to solve the abovementioned problem, and has an object to provide a semiconductor device the surface of which is smoothed by reducing the difference in level between an element region and an element isolation region.

In order to attain the above object, there is provided a method for forming a layer of semiconductor material such as silicon only on an exposed surface of a semiconductor substrate surrounded by an insulating film for element isolation, such as $SiO_2$ or PSG, by applying an energy beam to the semiconductor substrate. The formation of the silicon layer only on the exposed surface of the semiconductor substrate may be achieved either by applying the energy beam after forming a polysilicon layer on the whole surface of the substrate having the insulating film for element isolation formed thereon, or by applying the energy beam while accumulating the polysilicon layer on the substrate by gas phase growth.

According to this invention, a silicon layer of a single-crystal structure or a structure akin thereto can be formed only on the exposed surface of the substrate surrounded by the insulating film for element isolation. Thus, the difference in level between the element region and the element isolation region can be reduced or substantially eliminated by forming semiconductor elements by diffusing an impurity into the silicon layer.

This invention can be more fully understood from the following detailed description when taken in conjunction with the accompanying drawings, in which.

Figure 1:
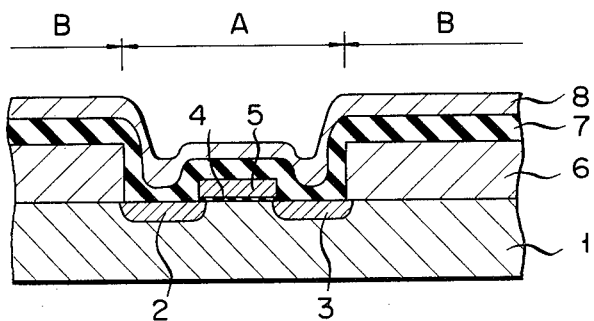
FIG. 1 is a sectional view of a prior art semiconductor device having a difference in level between a semiconductor element region and an element isolation region.
Figure 2:
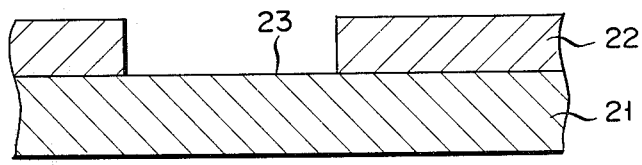
FIGS. 2 to 4 are sectional views for illustrating processes included in a method for manufacturing a semiconductor device having difference in these levels according to an embodiment of this invention.
Figure 3:
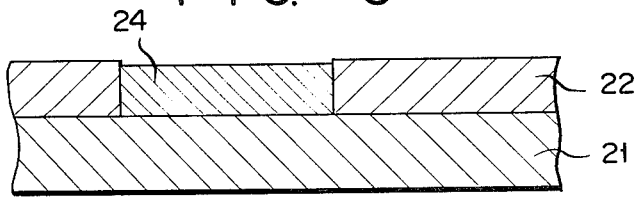

Now an embodiment of this invention will be described in detail with reference to the accompanying drawings. As shown in FIG. 2, an $SiO_2$ film with a thickness of approximately 1 $\mu$m is formed on a silicon substrate 21 by a conventional method, and an $SiO_2$ film 22 for element isolation and an exposed surface 23 of the substrate 21 at an opening portion of the $SiO_2$ film 22 are formed by selective etching. Then, the resultant structure is placed in a reaction chamber, and a polysilicon layer is formed to a thickness of approximately 7,000 Å on the substrate 21 by introducing silane gas such as monosilane into the chamber while keeping the temperature at e.g. 600° C. by a conventional method. Simultaneously with the accumulation of the polysilicon layer by such gas phase growth, a laser beam is applied to the substrate 21. In doing this, a thick beam may be applied to the whole surface of the substrate, or otherwise the substrate may be scanned with a narrow beam. Besides the laser beam, there may be used any other energy beams such as electron beam, ion beam, etc. By the irradiation with the energy beam, a silicon layer 24 is formed only on the exposed surface 23 of the substrate 21, as shown in FIG. 3.

It will be understood that silicon is deposited only on the exposed surface 23 of the substrate 21 but not on the insulating film 22 due to the difference in thermal conductivity between the substrate 21 and the insulating film 22 of $SiO_2$. Namely, heat energy applied to the exposed surface 23 by the energy beam is diffused into the substrate 21, exerting no influence on the deposition of silicon. With the insulating film 22 being of such material as $SiO_2$ that is poor in thermal conductivity, however, heat energy applied to the insulating film will not diffuse but will concentrate on the surface, so that silicon to be deposited will be scattered, failing to form a silicon layer. The irradiation conditions of the energy beam may be selected within such a range that heat energy capable of scattering silicon at least over the insulating film for element isolation can be applied. In the aforementioned embodiment, for example, the laser beam used has a wavelength of 1.06 $\mu$m oscillation frequency of 10 kHz, pulse width of 200 nsec, beam diameter of 50 $\mu$m $\phi$, scanning speed of 80 mm/sec, and energy density of 6 to 10 J/cm$^2$.

Figure 4:
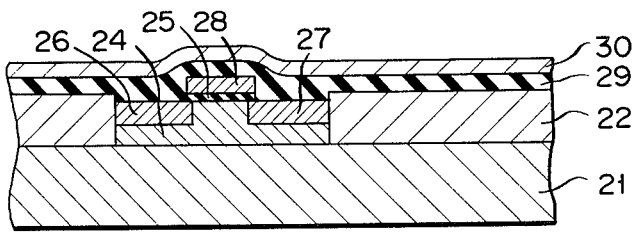

Melted and recrystallized by the energy beam, the silicon layer 24 formed in this manner has a single-crystal structure or a structure resembling the same. Therefore, a conventional method may be utilized in forming a semiconductor device on the silicon layer 24. As shown in FIG. 4, for example, a gate oxide film 25 and a gate electrode 28 are formed on the silicon layer 24, and a source 26 and a drain 27 are formed in the layer 24. An element region formed in this manner is substantially at the same level with the insulating film 22 for element isolation or element isolation region. Accordingly, an electrode and wiring 30 formed over those regions above an insulating film 29 will never be snapped or disconnected.

Although the energy beam is applied simultaneously with the gas phase growth of polysilicon in the aforementioned embodiment, it may be done after the gas phase growth of polysilicon. In this case, a polysilicon layer is deposited on the whole surface including the exposed substrate surface 23 and the insulating film for element isolation 22. However, the polysilicon layer on the insulating film for element isolation 22 will be scattered to disappear by the irradiation with the energy beam, so that a silicon layer of a single-crystal structure or a structure akin thereto will remain only on the exposed substrate surface 23.

Figure 5:
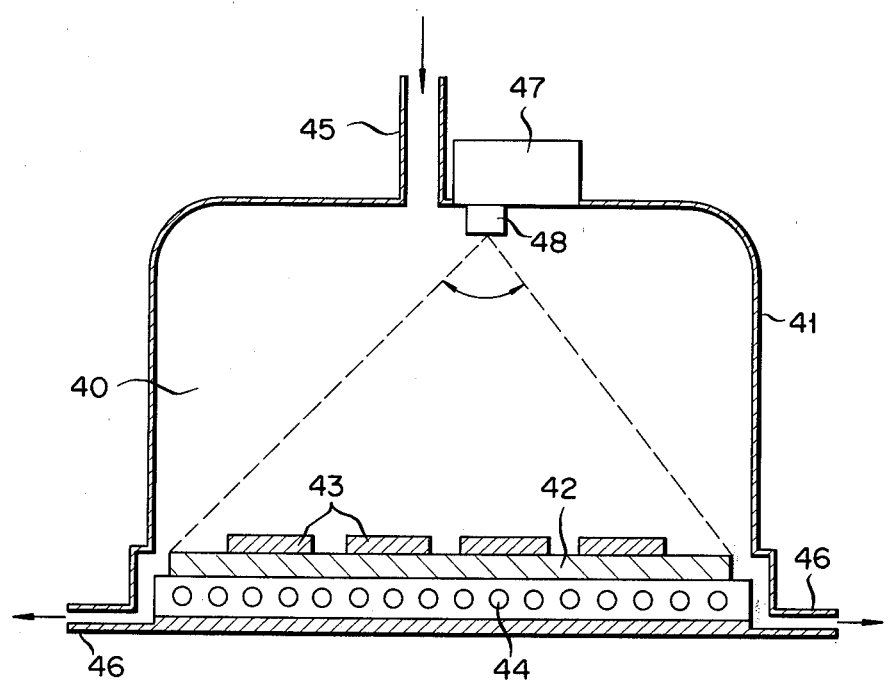
FIG. 5 is a schematic sectional view of an embodiment of an apparatus for carrying out the method of the invention.

Now there will be described an apparatus for carrying out the method of this invention. This apparatus includes a reaction chamber for gas phase growth and means for applying an energy beam to the surfaces of semiconductor substrates placed in the chamber. Referring now to the drawing of FIG. 5, there will be described an embodiment of such apparatus. A sample stand 42 is disposed at the bottom of a reaction container 41 forming a reaction chamber 40, and several substrates 43 on which the insulation film for element isolation as shown in FIG. 2 is formed are put on the stand 42. A heater 44 underlying the sample stand 42 controls the temperature for the gas phase growth. An inlet port 45 for gas such as silane gas is formed at the top of the reaction container 41, and a gas exhaust port 46 is attached to the bottom portion of the container 41. Mounted on the top of the reaction container 41 is an energy beam generator 47 such as an Nd:YAG laser generator of a continuous Q-switching type. If the beam diameter is too small to irradiate the whole surface of each sample at a time, the whole sample surface is scanned with the energy beam by using beam scanning means 48 such as a laser reflector.

According to this invention, a silicon layer of a single-crystal structure or a structure akin thereto may easily be formed only on an exposed surface of a substrate surrounded by an insulating film for element isolation. By forming any semiconductor element on the silicon layer, a difference in level between an element region and an element isolation region is substantially removed, so that there will be no fear of aluminium wiring snapping. Thus, despite the reduction of the aluminium wiring in thickness and in width due to the large scale integration, snapping or disconnection of the wiring will not easily occur, and the semiconductor device obtained may be improved in reliability. Further, suitable selection of materials for the insulating film for element isolation and the silicon layer on the exposed substrate surface will increase the element isolation efficiency of the isolation region to enable reduction of size thereof, thereby further facilitating the large scale integration.

What we claim is:

1. In a method for manufacturing a semiconductor device, the process comprising the steps of:
   a. forming an insulating film on selected portions of a semiconductor substrate; and
   b. tending to accumulate polysilicon on the entire surface of the insulating film and the exposed portions of the semiconductor substrate simultaneous with or followed by exposing said polysilicon to an energy beam, whereby the polysilicon tending to accumulate on the exposed portions of the semiconductor substrate is crystallized to silicon and the polysilicon tending to accumulate on the surface of the insulating film is not crystallized but scattered by the energy beam.

2. In a method for manufacturing a semiconductor device, the process comprising the steps of:
   a. forming an insulating film on selected portions of a semiconductor substrate;
   b. tending to accumulate polysilicon on the entire surface of the insulating film and the exposed portions of the semiconductor substrate; and
   c. exposing said polysilicon to an energy beam simultaneous with said step of tending to accumulate polysilicon, whereby the polysilicon tending to accumulate on the exposed portion of the semiconductor substrate is crystallized to silicon and the polysilicon tending to accumulate on the surface of the insulating film is not crystallized but scattered by the energy beam.

3. In a method for manufacturing a semiconductor device, the process comprising the steps of:
   a. forming an insulating film on selected portions of a semiconductor substrate;
   b. tending to accumulate polysilicon on the entire surface of the insulating film and the exposed portions of the semiconductor substrate; and
   c. exposing said polysilicon to an energy beam after said step of tending to accumulate polysilicon, whereby the polysilicon tending to accumulate on the exposed portion of the semiconductor substrate is crystallized to silicon and the polysilicon tending to accumulate on the surface of the insulating film is not crystallized but scattered by the energy beam.

4. A process according to any one of claims 1–3, wherein said energy beam is a laser beam, electron beam, or ion beam.

5. A process according to any one of claims 1–3, wherein said semiconductor substrate is formed of silicon, and said insulating film is formed of $SiO_2$ or PSG.

6. In a method for manufacturing a semiconductor device, wherein at least one first region of a semiconductor substrate or a layer thereon has thermal conductivity sufficient to permit the diffusion into said region or layer of energy applied to the surface thereof and at least one second region of said semiconductor substrate or a layer thereon has poor thermal conductivity relative said first region and tends to concentrate on the surface thereof energy applied thereto, the process comprising the steps of tending to accumulate polysilicon on the entire exposed surfaces of the semiconductor substrate and any layers thereon, including surfaces of said first and second regions, simultaneous with or followed by exposing said polysilicon to an energy beam, whereby the polysilicon tending to accumulate on the surface of said first region is crystallized to silicon and the polysilicon tending to accumulate on the surface of said second region is not crystallized but scattered by said energy beam.

7. In a method for manufacturing a semiconductor device, wherein at least one first region of a semiconductor substrate or a layer thereon has thermal conductivity sufficient to permit the diffusion into said region or layer of energy applied to the surface thereof and at least one second region of the semiconductor substrate or a layer thereon has poor thermal conductivity relative said first region and tends to concentrate on the surface thereof energy applied thereto, the process comprising the steps of tending to accumulate polysilicon on the entire exposed surfaces of the semiconductor substrate and any layers thereon, including surfaces of said first and second regions, simultaneous with exposing said polysilicon to an energy beam, whereby the polysilicon tending to accumulate on the surface of said first region is crystallized to silicon and the polysilicon tending to accumulate on the surface of said second region is not crystallized but scattered by said energy beam.

8. In a method for manufacturing a semiconductor device, wherein at least one region of a semiconductor substrate or a layer thereon has thermal conductivity sufficient to permit the diffusion into said region or layer of energy applied to the surface thereof, and at least one second region of the semiconductor substrate or a layer thereon has poor thermal conductivity relative said first region and tends to concentrate on the surface thereof energy applied thereto, the process comprising the steps of tending to accumulate polysilicon on the entire exposed surfaces of the semiconductor substrate and any layers thereon, including surfaces of said first and second regions, followed by exposing said polysilicon to an energy beam, whereby the polysilicon tending to accumulate on the surface of said first region is crystallized to silicon and the polysilicon tending to accumulate on the surface of said second region is not crystallized but scattered by said energy beam.

9. A process according to any one of claims 6–8, wherein said energy beam is a laser beam, electron beam, or ion beam.

10. A process according to any one of claims 6–8, wherein said semiconductor substrate is formed of silicon, and said insulating film is formed of $SiO_2$ or PSG.

* * * * *